(12) United States Patent
Didiot et al.

(10) Patent No.: US 10,774,768 B2
(45) Date of Patent: Sep. 15, 2020

(54) METHOD OF MODELLING AFR TO COMPENSATE FOR WRAF SENSOR

(71) Applicant: DELPHI AUTOMOTIVE SYSTEMS LUXEMBOURG SA, Bascharage (LU)

(72) Inventors: Damien Didiot, Hayange (FR); Julien Ardeois, Gelle (LU)

(73) Assignee: DELPHI AUTOMOTIVE SYSTEMS LUXEMBOURG SA, Luxembourg (LU)

(*) Notice: Subject to any disclaimer, the term of this patent is extended or adjusted under 35 U.S.C. 154(b) by 14 days.

(21) Appl. No.: 16/303,257

(22) PCT Filed: May 23, 2017

(86) PCT No.: PCT/EP2017/062333
§ 371 (c)(1),
(2) Date: Nov. 20, 2018

(87) PCT Pub. No.: WO2017/202805
PCT Pub. Date: Nov. 30, 2017

(65) Prior Publication Data
US 2019/0203655 A1 Jul. 4, 2019

(30) Foreign Application Priority Data
May 24, 2016 (GB) .................................. 1609103.5

(51) Int. Cl.
*F02D 41/14* (2006.01)
*F01N 3/20* (2006.01)
(Continued)

(52) U.S. Cl.
CPC ......... *F02D 41/1458* (2013.01); *F01N 3/035* (2013.01); *F01N 3/2066* (2013.01); (Continued)

(58) Field of Classification Search
CPC ...... F01N 11/007; F01N 13/009; F01N 3/035; F01N 3/2066; F01N 9/007; F01N 2560/025; F02D 41/02; F02D 41/14; F02D 41/1445; F02D 41/1454; F02D 41/1458; F02D 2041/1423; F02D 2041/1431; F02D 2250/32; G06F 30/20; Y02T 10/24
See application file for complete search history.

(56) References Cited

U.S. PATENT DOCUMENTS

4,770,147 A 9/1988 Sogawa
5,363,831 A 11/1994 Tomisawa et al.
(Continued)

*Primary Examiner* — Brandon D Lee
(74) *Attorney, Agent, or Firm* — Joshua M. Haines (57) ABSTRACT

A method of providing a model which provides air/fuel ratio at a point of an air/fuel sensor located in an exhaust system of an engine includes a) providing a first model which provides a first air/fuel ratio which is outlet from an exhaust manifold of the engine; b) measuring or estimating volumetric flow through the exhaust; c) applying a transfer function to the first air/fuel ratio to provide a model of the air/fuel ratio at the sensor. The transfer function includes a first order filter and is dependent on the volumetric flow. The transfer function has a time constant equivalent to a filter coefficient which is 1/time constant which is determined based on the flow rate.

12 Claims, 10 Drawing Sheets

(51) Int. Cl.
    *F01N 13/00*     (2010.01)
    *F01N 3/035*     (2006.01)
    *G06F 30/20*     (2020.01)
    *F01N 9/00*     (2006.01)
    *F01N 11/00*     (2006.01)

(52) U.S. Cl.
    CPC ............ *F01N 9/007* (2013.01); *F01N 11/007* (2013.01); *F01N 13/009* (2014.06); *F02D 41/1445* (2013.01); *F02D 41/1454* (2013.01); *G06F 30/20* (2020.01); *F01N 2560/025* (2013.01); *F02D 2041/1423* (2013.01); *F02D 2041/1431* (2013.01); *F02D 2250/32* (2013.01); *Y02T 10/24* (2013.01)

(56) References Cited

U.S. PATENT DOCUMENTS

| | | | |
|---|---|---|---|
| 2006/0271270 A1* | 11/2006 | Chauvin | F02D 41/008 701/109 |
| 2007/0199307 A1 | 8/2007 | Tsumagari | |
| 2014/0358355 A1* | 12/2014 | Zimmerschied | F02D 41/1495 701/31.1 |
| 2015/0013442 A1 | 1/2015 | Michalske | |
| 2015/0032359 A1 | 1/2015 | Tordin | |
| 2015/0047415 A1 | 2/2015 | Michalske | |

\* cited by examiner

METHOD OF MODELLING AFR TO COMPENSATE FOR WRAF SENSOR

CROSS REFERENCE TO RELATED APPLICATIONS

This application is a national stage application under 35 USC 371 of PCT Application No. PCT/EP2017/062333 having an international filing date of May 23, 2017, which is designated in the United States and which claimed the benefit of GB Patent Application No. 1609103.5 filed on May 24, 2016, the entire disclosures of each are hereby incorporated by reference in their entirety.

FIELD OF THE INVENTION

This disclosure relates to Air Fuel sensors such as Wide Range Air Fuel sensors (WRAF) and models provided therefor. Such models are used in controlling appropriate fuelling. It has application to improving the reliability of such sensor information as well as such models. It has particular, but not exclusive application to engine systems which use exhaust gas recirculation.

BACKGROUND TO THE INVENTION

It is known to use sensors such as a wide range Air Fuel sensor (WRAF) located in internal combustion engine exhaust lines to assess the ratio of fuel and air in exhaust gases. Using information from such sensors allows engine control units to accurately adjust the fuel quantity delivered to meet expected or demanded air/fuel ratio.

One way is that this is done is that the ECU predicts the air to fuel ratio expected at the sensor location based on air entering the engine exhaust gas e.g. re-circulated through the engine as well as fuel injected into the combustion chamber. The expected A/F ratio is then compared to the value from the WRAF sensor and any difference provides data to adjust and correct the (e.g. feedback) control in the fuel supply (e.g. fuel dispensed to the injectors).

The ECU thus relies to a large extent on the accuracy of the WRAF sensor to ensure good control. Sensors are inherently sensitive to specific conditions, such as pressure. In some systems the sensor signal values are adjusted to compensate for pressure variation. Also, to reduce steady state error, the sensor signal value is sometimes self-adjusted in a pure air mixture.

A problem however is that sensors age, and the characteristics change and thus accuracy of sensors change. This is partly due to chemical and mechanical effects in use. It is an object of the invention to overcome these problems.

STATEMENT OF INVENTION

In one aspect is provided In an engine, a method of providing a model which provides the parameter of the air/fuel (A/F) ratio (AFR3) at a point in the exhaust system of said engine at a point where an air/fuel sensor is located, comprising;

a) providing a first model which provides the air/fuel ratio which is outlet from the exhaust manifold of said engine (AFR1);

b) measuring or estimating the volumetric flow through the exhaust;

c) applying a transfer function to said A/F ratio (AFR1) determined by said first model to provide a model of the A/F ratio at the location of said sensor (AFR3), said transfer function including a first order (lag) filter, said transfer function being dependent on said volumetric flow determined from b), said transfer function having a time constant $\tau$, equivalent to a filter coefficient of K where $K=1/\tau$; said time constant $\tau$ or filter coefficient being determined dependent on flow rate, characterised in amending the value of the determined time constant $\tau$ or filter coefficient K, by applying a correction factor; said correction factor being determined or updated based on the following further steps:

d) measuring the A/F ratio (AFR4) at said point by said A/F sensor;

e) over a time period, comparing the computed value of the modelled A/F ratio (AFR34) at the sensor location from step c) with the value from the actual A/F sensor(AFR4);

f) determining or amending one or more correction factors (cf/CR1) to filter coefficients (K) or time constants ($\tau$) of said applied transfer function based on said comparison.

Step c) may comprise applying a delay in addition to said transfer function to said A/F ratio determined by said first model (AFR1) to provide a model of the A/F at the location of said sensor (AFR3).

Step e) may comprise comparing the gradients of the computed value of the modelled A/F ratio at the sensor location (AFR3) with the value from the actual A/F sensor (AFR4).

The method may include determining the ratio of said gradients and determining said correction factor dependent on said ratio.

Said coefficient correction factor may also determined dependent on flow rate.

The method may include storing a MAP or look-up table of flow rates against said correction factors, and amending said stored correction factors dependent on result of steps d) and e).

Said comparison in step e) may include determining a filter coefficient (cf) correction factor offset value, said correction factor offset value being defined as a calibratable gain*(1−gradient ratio), where the gradient ratio is the gradient of the AFR from the sensor sensor(AFR4)/gradient of the modelled A/F ratio at the sensor location (AFR3).

Said correction factor offset value may be applied to and used to amend one or more stored or initial correction factors.

Said first order filter may be defined a lag function of $(1/(\tau s+1))$ where $\tau$ is said time constant.

Step e) may comprise amending the determined value of the time constant $\tau$ of first order filter, referred to in step c), according to the equation:

$\tau_{amended} = \tau_{determined} * CF1$ where CF1 is the time constant correction factor determined from step f).

Step e) may comprise amending the determined value of the filter coefficient K of the first order filter according to the equation:

$K_{amended} = K_{determined} * cf$ where cf is the filter coefficient correction factor determined from step f)

Initial values of the stored correction factors (cf) for the filter coefficient K may be amended according to the equation:

updated correction factor=initial value of correction factor (cf)−(calibratable gain*(1−gradient ratio))

Said method is preferably implemented consequent to a change of A/F ratio from rich to lean.

A turbocharger may be located between the exhaust manifold and the sensor location.

In an aspect therefore the aging or sensor dynamic deviation of a WRAF sensor is assessed.

BRIEF DESCRIPTION OF DRAWINGS

The invention will now be described by way of example and with reference to the following figures of which:

FIG. 4 *b* which shows the AFR model at WRAF (AFR3), aged WRAF sensor AFR signal AFR41, and fuel correction multiplier (FCM) over a long time span consequent to varying general AFR;

BACKGROUND

Figure 1:
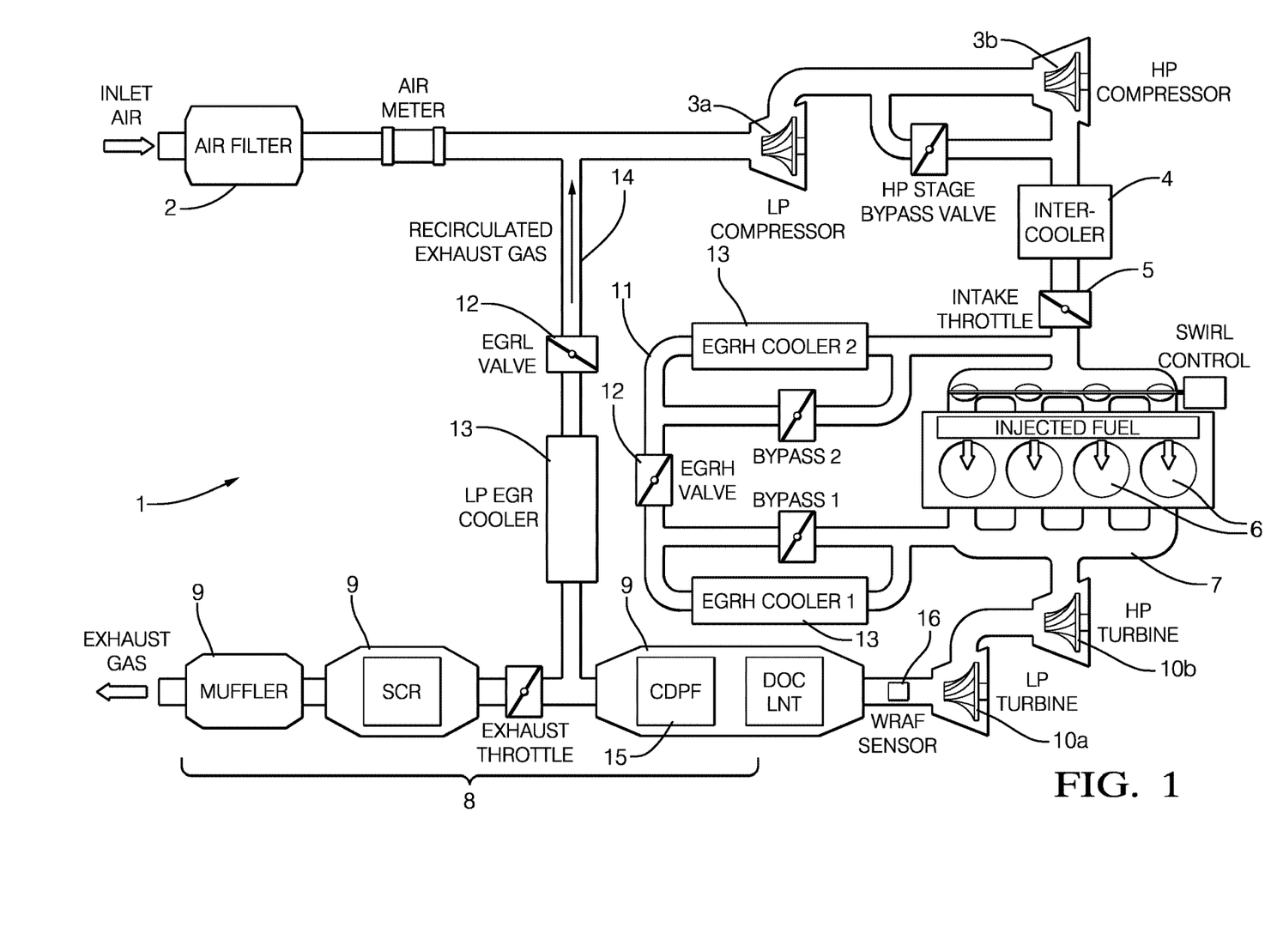
FIG. 1 shows a diagram of a turbocharged engine system.

FIG. 1 shows a diagram of a turbocharged engine system 1. Inlet or intake air passes through filter 2 and is compressed by a compressor 3 which may be formed from two compressor stages: a low pressure compressor 3*a* and a high pressure compressor 3*b*. The intake flow may then pass through an intercooler 4 and via an intake throttle 5 to cylinders 6 where it is mixed with injected fuel before combustion. The resultant exhaust gases exit the engine via the exhaust manifold 7 and though the exhaust system/line 8 which may include various units 9 such as a Diesel particulate filter SCR catalyst system muffler and such like. On exiting though the exhaust manifold, the gases may also be passed via a turbine 10 (of the turbocharger) in order to power the compressor. The turbine may comprise low pressure and high pressure stages 10*a* 10*b*. There may be provided an exhaust gas recirculation path 11 from the exhaust manifold to the inlet manifold as shown which is controlled by exhaust gas recirculation valves 12. Coolers 13 may be provided each with by-pass valve 13 which can be controlled.

A further exhaust gas recirculation path 14 may also be provided again under control of an EGRL valve. In this path flow exiting from a DPF filter 15 is passed to the air intake; in the figure this is the intake portion between the air filter and compressor inlet. Typically a WRAF sensor 16 is located as shown.

It is to be mentioned that aspects of the invention are applicable to engines without turbochargers or EGR.

Figure 2:
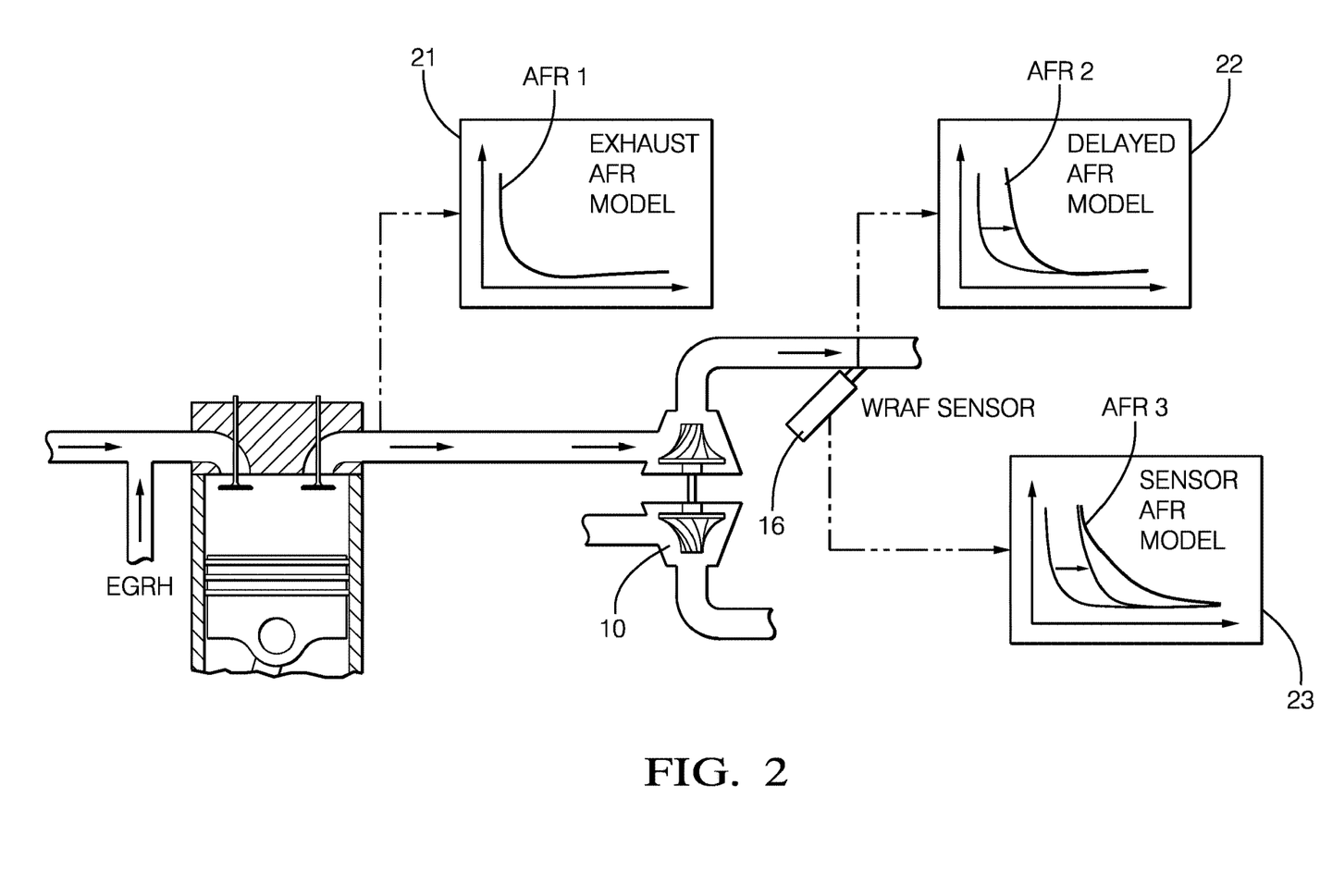
FIG. 2 illustrate air fuel ratio modelling.

FIG. 2 illustrate air fuel ratio modelling. A model of AFR at the exhaust outlet (AFR1) is provided at 21. This is used to provide a delayed model of the AFR at the sensor location (AFR 2). This delayed AFR model is effectively provided by applying a pure time delay to AFR1. A 1st order low-pass filter is applied to signal AFR2 to provide the (final) Sensor AFR Model AFR3 which effectively the modelled AFR "inside the sensor" i.e. as should be seen by the sensor. So in summary the sensor AFR modelled is the exhaust AFR model with a time delay and first order (lag) filter.

So to recap, AFR is modelled at the exhaust and the AFR modelled at the location downstream in the exhaust (at the WRAF sensor) is modelled as a delayed function of the AFR modelled at the exhaust. Thus a filter is that is used to model the AFR signal at the WRAF sensor location from the exhaust AFR model is a typically first order lag response, in addition to a time delay. In preferred prior art examples the coefficients of the filter are amended dependent on volumetric flow through the system e.g. exhaust.

So:

Delayed AFR Model (AFR2)=AFR model at exhaust (AFR1)+delay

Figure 3:
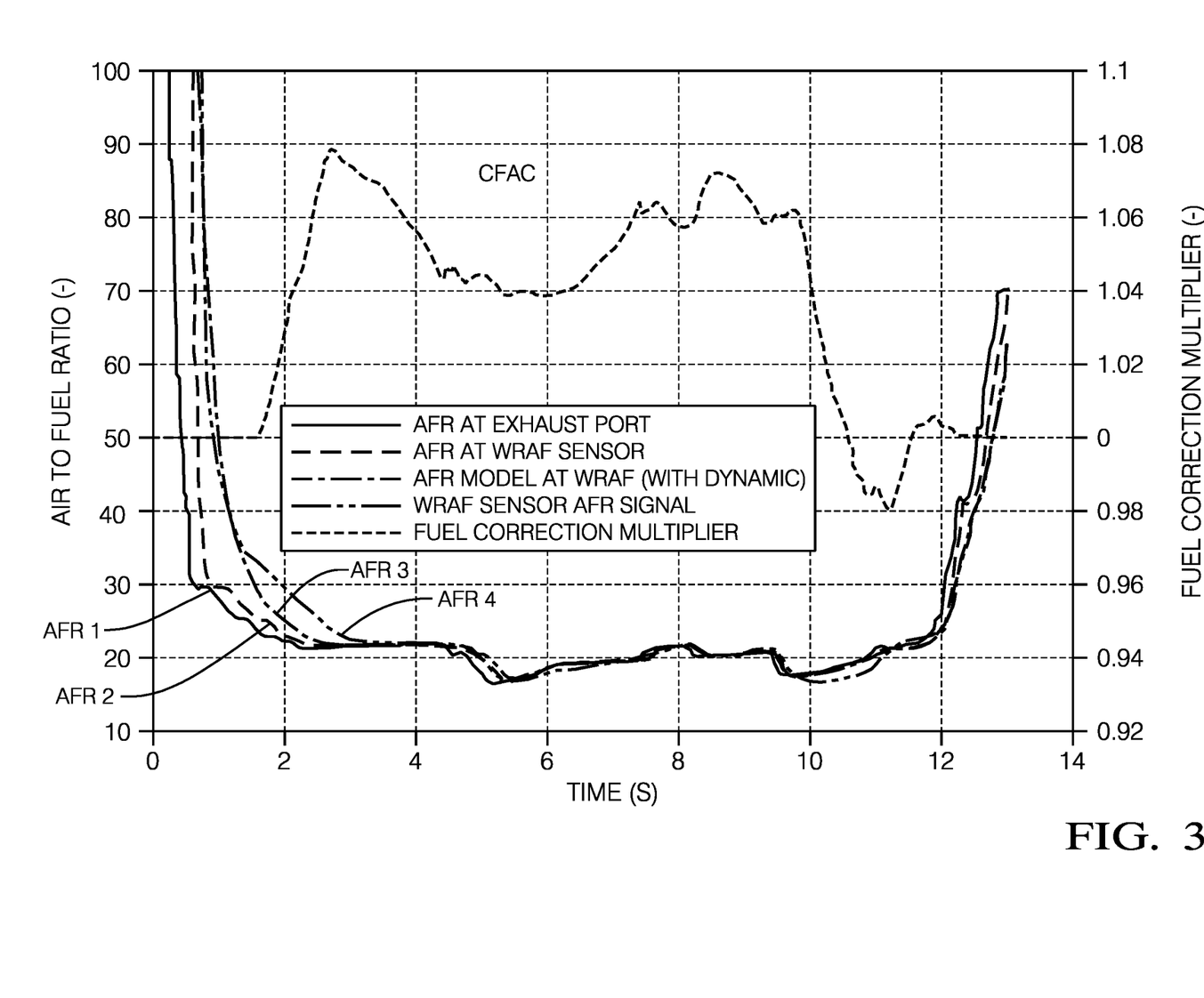
FIG. 3 which shows against time the following: AFR at the exhaust port AFR1 (provided by a model), the AFR modelled at the AFR sensor location derived from the AFR modelled at the exhaust AFR2, the AFR modelled sensor signal (AFR3) and the actual AFR from the sensor AFR4.

Sensor AFR Model (AFR3)=Delayed AFR Model (AFR2)*(1(/τs+1))

τ is typically dependent on the flow (estimated or measured) through the exhaust The delayed (and filtered) AFR model is typically used such that it is compared to the signal from the actual WRAF sensor AFR4 to correct fuelling deviation. FIG. 3 which shows against time the following: AFR at the exhaust port AFR1 (provided by a model), the AFR modelled at the AFR sensor location derived from the AFR modelled at the exhaust AFR2, the AFR modelled sensor signal (AFR3) and the actual AFR from the sensor AFR4. Where there is a difference between the AFR model at the sensor location AFR3 and the signal form the AFR sensor itself AFR4, a correction factor (CFAC) is determined. This can be applied in the fuelling control (existing technology) to bring the sensor signal to the expected AFR from the model As mentioned, in current air fuel ratio modelling at the sensor location, the sensor response behaviour under transient conditions is modelled as a delay and first order filter of the AFR model at the exhaust. In aspects of the invention, the filter coefficients of the first order filter are adapted and corrected to compensate for a non-ideal AFR (WRAF) sensor, so that the modelled air fuel ratio matches the sensor response.

Under let off and fuel cut off (increasing air/fuel ratio) conditions, modelling of the expected air fuel ratio at the sensor location is accurate because it is less dependent on errors in the fuel delivery. The air to fuel ratio steps delivered by the engine under those conditions are sufficiently dynamic to assess WRAF sensor response behaviour and occur often enough under normal driving conditions.

Figure 4A:
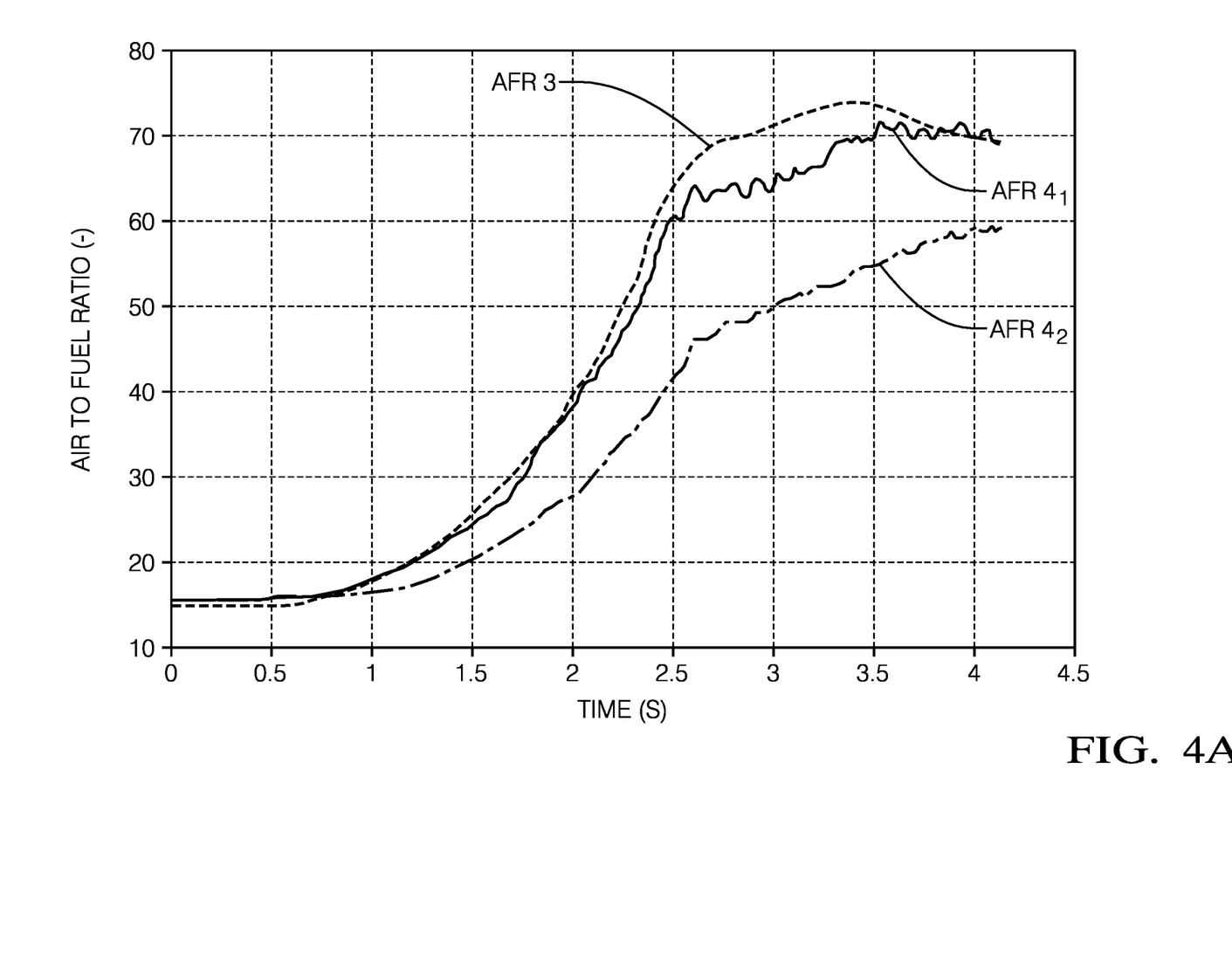
FIG. 4*a* shows a plot over a short time span with dynamic increase in A/F ratio: AFR model at the WRAF location (AFR3), nominal (assuming perfect non-aged sensor) WRAF sensors AFR signal (AFR41), and aged WRAF sensor AFR signal (AFR42)
Figure 4B:
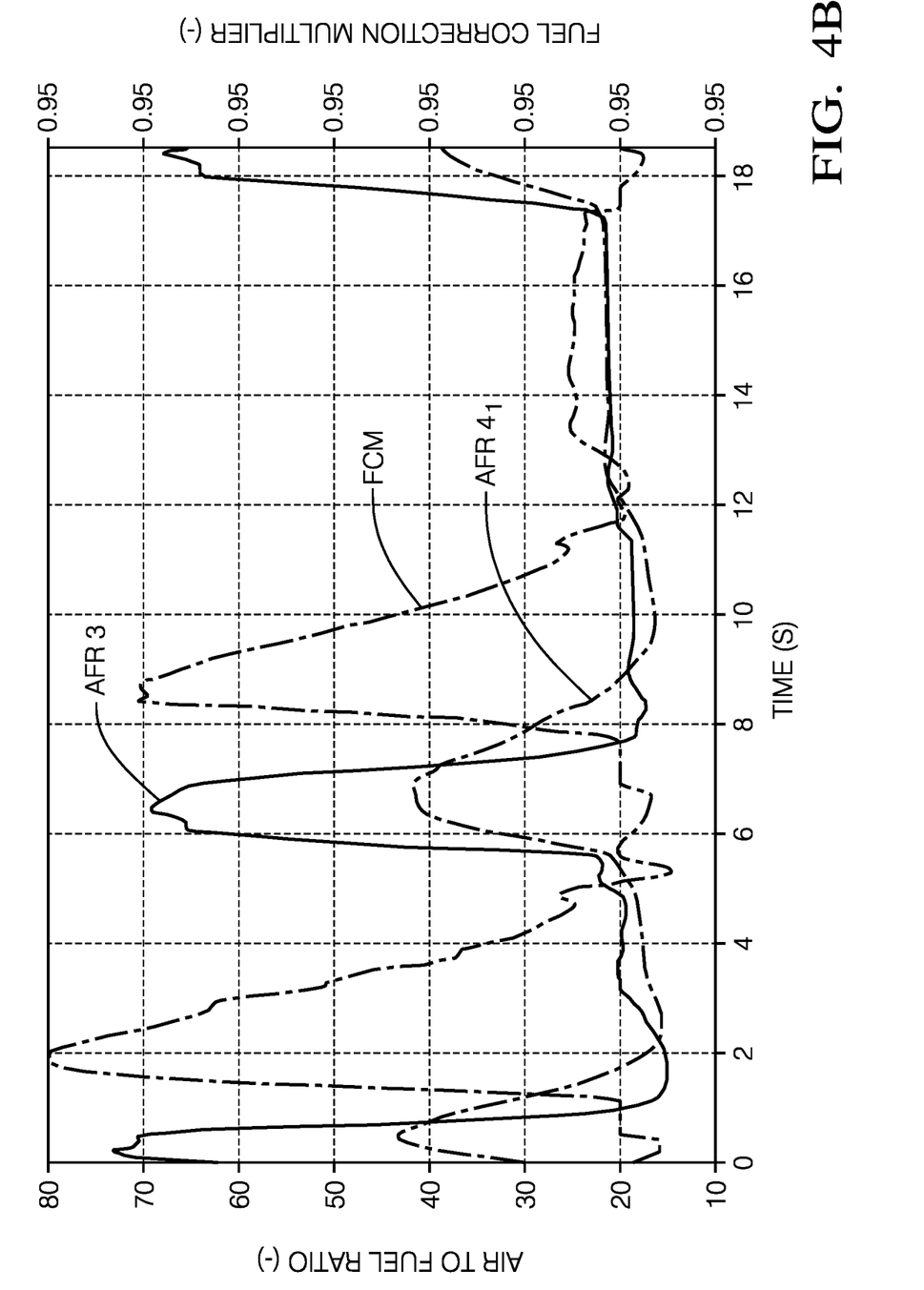

As mentioned in the introduction, the actual AFR sensor may deviate from the modelled AFR sensor signal due to the aforementioned aging effects, particularly in the transient response. FIG. 4*a* shows a plot over a short time span with dynamic increase in A/F ratio. The figure shows plots of AFR model at the WRAF location (AFR3), nominal (assuming perfect non-aged sensor) WRAF sensors AFR signal (AFR41), and aged WRAF sensor AFR signal (AFR42). As can be seen the response of an aged WRAF, there is a large deviation from the expected plot between the latter signal and the other two signals. It is to be noted that the air fuel gradient, with respect to time, is high. The volumetric flow during the air fuel step is quite steady. An aged sensor can have a completely different response compared to the nominal one. The model calibrated to fit the nominal sensor is not any more valid for an aged sensor. So FIG. 4*a* shows plots consequent to typical increasing air to fuel ratio for AFR WRAF sensor signal for a nominal sensor AFR41 i.e. a sensor assumed to be accurate and behaving as expected, and an aged (WRAF) sensor AFR42, as well as the AFR model at the (WRAF) sensor location AFR3. This results also in an erratic fuel correction multiplier (for the control of fuel) as seen by FIG. 4 b which shows the AFR model at WRAF (AFR3), aged WRAF sensor AFR signal AFR41, and fuel correction multiplier (FCM) over a long time span consequent to varying general AFR. As can be seen though the correction factor varies wildly.

DETAILED DESCRIPTION OF THE INVENTION

The inventors have determined that under e.g. certain (e.g. transient conditions) the mean gradient of the air to fuel ratio according to the WRAF sensor can be compared to the mean gradient of the same variable according to the model at the WRAF sensor location, and useful information obtained from such a comparison, in particular to correct the model for sensor deterioration or sensor faults.

Figure 5:
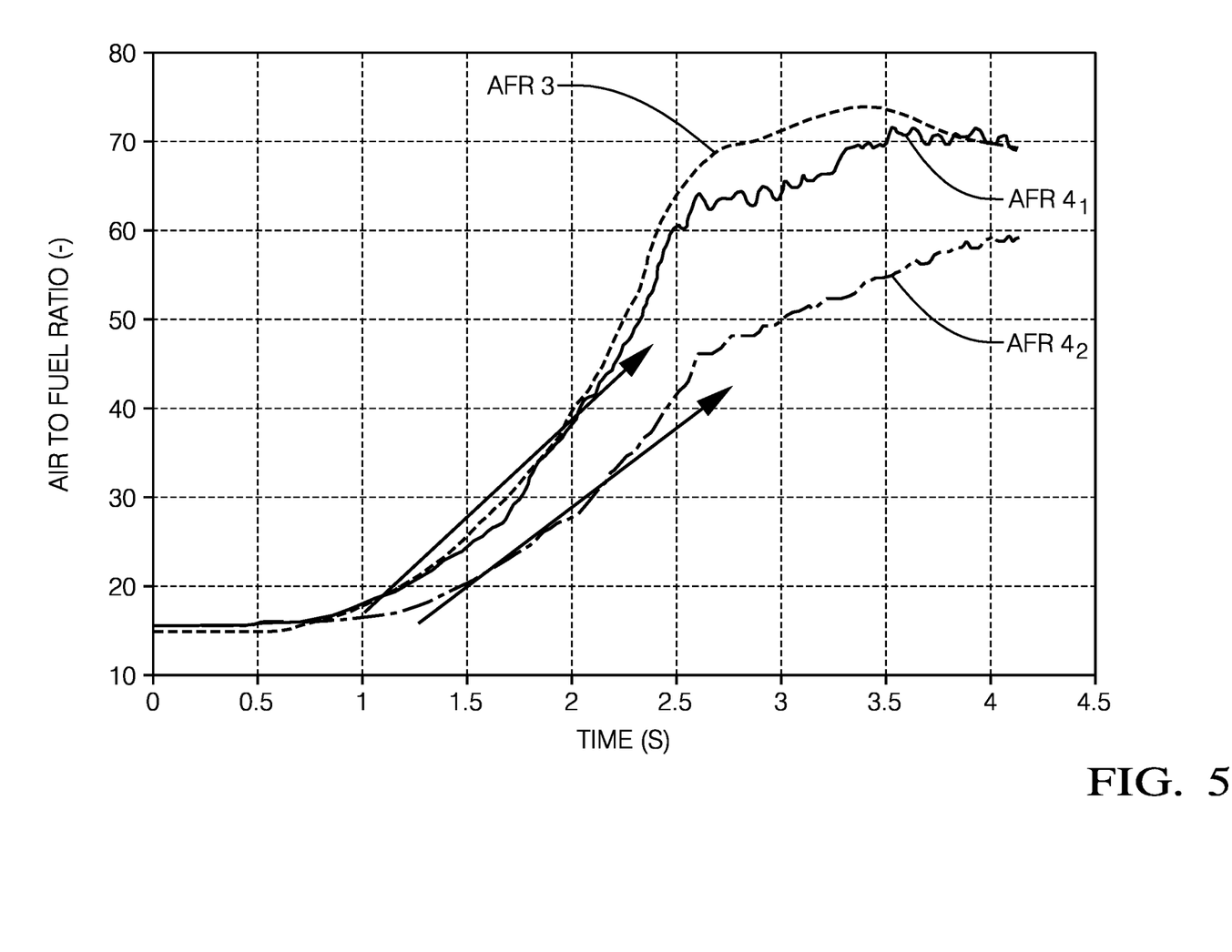
FIG. 5 is similar to FIG. 4*a* and also shows arrows showing the gradients of the actual aged AFR sensor AFR42 and the AFR model signal AFR3.

FIG. 5 is similar to FIG. 4a showing against plots of AFR model at the WRAF location, nominal (assuming perfect non-aged sensor) (AFR3), nominal non-aged WRAF sensor AFR signal AFR41, and aged WRAF sensor AFR signal AFR42. The figure also shows arrows showing the gradients of the actual aged AFR sensor AFR42 and the AFR model signal AFR3. The ratio of these gradients provides valuable information and allows the filter coefficients (i.e. value of $\tau$) of the model to be amended so as to compensate the system for non-ideal e.g. the aged sensor.

In a basic example the gradients are calculated, and the value of $\tau$ used to model the downstream AFR from the model exhaust AFR is amended dependent on these. In examples the gradient ratios (i.e. ratio of the ratios) is used to determine a correction factor to adjust the (filter coefficient K) or time constant $\tau$.

Example 1—Basic Example

In a simple example of the invention, the flow is determined and used to determine an initial time constant $\tau_{nominal}$. (Initially calibrated function of the flow to be representative of a nominal WRAF sensor behavior)

Alternatively this could be regarded as determining a nominal filter coefficient K (discrete low-pass filter) and is linked with the following relation to the filter time constant $\tau$ and the calculation (time) step T (sample time): where $K=T/\tau$ The Correction factor 'cf' is then determined by comparing the gradients of the actual sensor AFR4 and modelled sensor AFR3 (i.e. from the gradient ratio) to determine a revised corrected value of $\tau$ $\tau$corrected=$\tau$nominal*CR1 where CR1 is a correction factor applied to $\tau$ Or if we refer to the filter coefficient K $\tau_{corrected}=\tau_{nominal}/cf$, where $K_{corrected}=K_{nominal}*cf$
with $K=T/\tau$ So cf=1/CR1

In the following, the term "correction factor" can be understood as referring to CR1 or cf depending on context.

During the gradient evaluation, the mean volumetric flow surrounding the sensor is preferably measured or assessed from a model, so that the flow which the $\tau$ has to be adapted is identified; in this way $\tau$ is amended according to the ratio of the gradients as well as the calculations using measurement of volumetric flow. A look-up table may be provided where the correction factor cf/CR1 is stored against volumetric flow. This table may be amended as a result of the methodology described above.

Example 2

The following summarises a method as to how the correction factor cf may be determined:

In a first (learning) stage (occurs in specific rich-to-lean or lean-to-rich transition) a learning strategy assesses the gradient ratio (AFR sensor (AFR4) over AFR model (AFR3), which preferably may be an average ratio during the learning phase or period (e.g. while learning conditions are valid). In parallel, an average flow all along the learning phase is calculated. At the end of the learning process, the average gradient ratio is determined and may be stored along with the computed average flow. Initially a look up table may store correction factors all equal to 1 for particular (discrete values) of flow or initialized with appropriate initial values. The correction factor may be determined for the measured flow and the table updated. In an example values of the correction factor with respect to the stored discrete values of flow may be amended for future calculation. For example the entries of the correction factor with respect to the discrete values of the flow either side of the measured flow may be amended. The amendment may be weighted according to how close the actual measured flow is to the discrete values in the table. This will be explained in more detail hereinafter.

The correction factor determination may be implemented continuously such that correction factor and table of correction factors for particular (nominally chosen) flows is continuously updated. The instantaneous correction factor is looked-up in the correction factor table at the zone corresponding to the current flow. This correction factor is applied as a multiplier to the 'nominal' value of $\tau$ coefficient (also looked-up at the current flow)

As mentioned, preferably the method is performed under certain condition. Conditions enabling the sensor response evaluation according to examples is implemented preferably when there is a low air fuel ratio gap between the sensor and model (at WRAF) location initially.

Model air fuel ratio below a set at the valuation start; calculation is thus preferably disabled if it goes above this threshold. Thus preferably A/F ratio (modelled) must be below a certain level. So for rich-to-lean transitions, the learning algorithm (methodology according to aspects of the invention) will be launched only if the initial modelled A/F ratio is below a defined threshold. This ensures that the assessed transition will cover a wide AFR range.

There should be preferably a sufficiently positive or negative air fuel ratio: again calculation is thus preferably disabled if the A/F goes below a certain threshold.

Preferably the mean flow should be within set limits. Also preferably the ratio of the air fuel ratio gradients seen by the sensor and the model are within a particular range (e.g. outside a calibratable dead band area) to avoid correction factor to oscillate above and below the correct value.

When the calculation is completed on an air to fuel ratio step, the time constant $\tau$ used to model the WRAF sensor behaviour is gradually adapted to fit the real sensor response as a result of applying e.g. a the correction factor to the value of $\tau$ of the filter of the model.

As mentioned above the correction factor "cf" may be calculated from the ratio of the gradients and dependent on the flow. The factor dependent on the flow may be provided by a one dimensional look up table. The flow may be averaged during the sampling time (i.e. over the time period the gradients are determined) and the average flow rate used to determine an intermediate flow factor so in other words the flow factor (and subsequently the coefficient correction factor determined form this and the ratio of gradients); so the correction factor determined is effectively "shared" between the two surrounding flow breakpoints (i.e. in the table of correction factors). The weighting can be based on the distance between the mean flow derived from the calculation and the breakpoints. A calibratable gain allows storing only a part of the total observed deviation to be included in the filtered model.

Outline Methodology According to One Example

Figure 6:
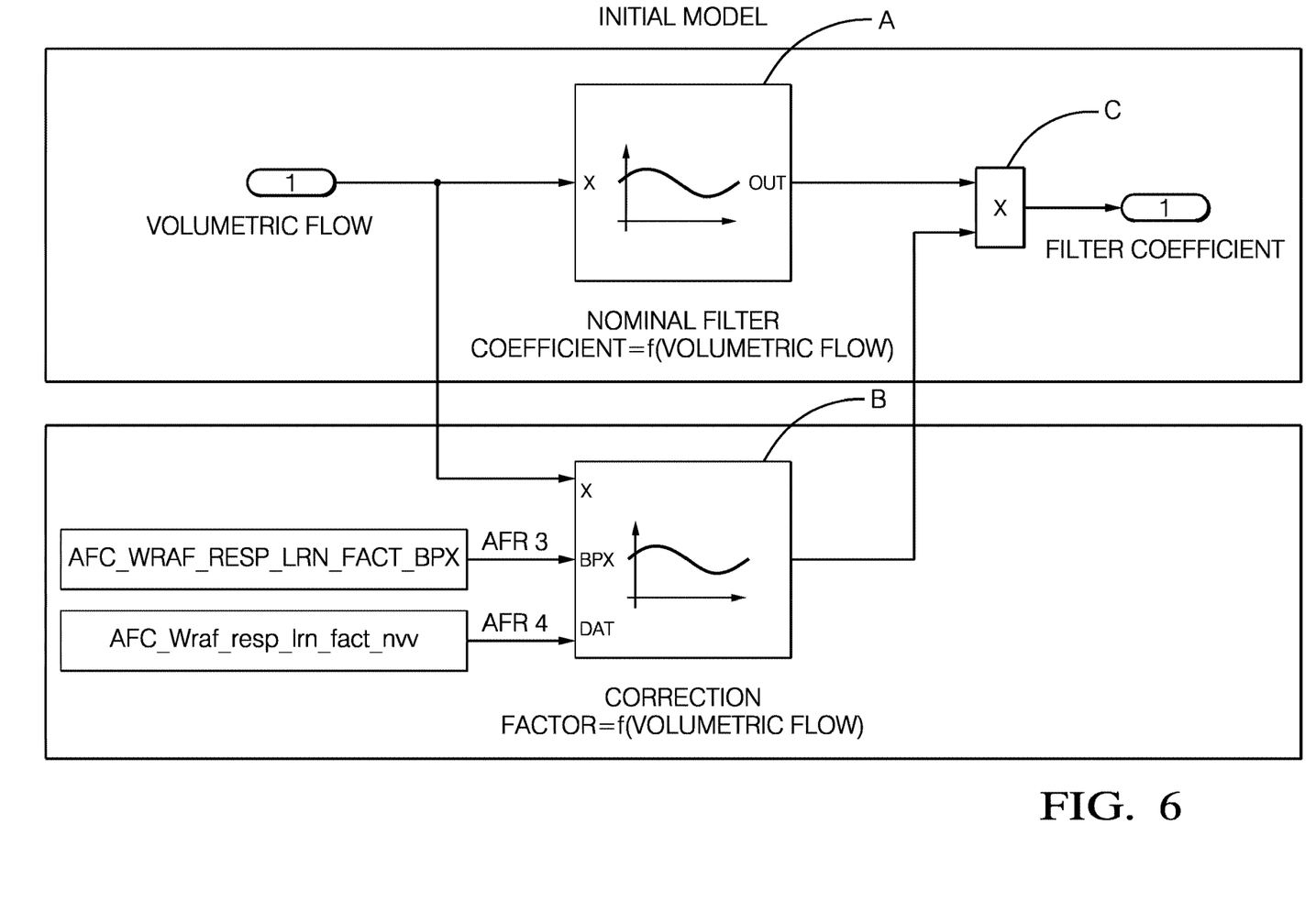
FIG. 6 shows a block diagram showing illustrating one example of the invention.

In the top portion of the figure is shown the current methodology where block A computes the nominal (model) value of τ (filter coefficient) based on volumetric flow.

In an improvement according to the invention a further block B is provided. This block shows a table of flow values against correction factors (cf) i.e. to be applied to the filter coefficient i.e. τ. The figure shows that an input into block B is the actual WRAF sensor signal (AFR4) and the modelled AFR signal at the WRAF location (AFR3). An optional input is the volumetric flow. In block B a (filter coefficient) correction factor cf is determined, which is then applied to the initial nominal value of τ determined from block A to determine a revised (updated) value of τ.

To sum up block A from flow input, outputs initial filter coefficient (nominal sensor) and block B from flow input, outputs the correction factor to be applied to initial filter coefficient to get the corrected filter coefficient at the corresponding flow input. In an example this is computed as follows. Initially the values of the correction factor for a set of flow rates in a table (i.e. all the cf values) are initially assumed/set to be 1. The gradient over a certain measured time-span of the two signals (AFR3 and AFR4) input to block B is determined, that is the ratio of these gradients is computed=gradient of the AFR sensor(AFR4)/gradient of the AFR sensor model(AFR3).

As mentioned this may involve computing the average gradients e.g. over the corresponding time span. As mentioned this is preferably performed under certain conditions where AF ratio is changing at a relatively high rate. A filter (τ) correction factor (cf) is then computed and used to amend the value of τ determined form block A. The computed value of the correction factor can also be and used to amend correct the filter coefficient stored in block A. So block B corresponds to the correction factor application to the initial model.

So to summarise so far Block A determines the initial value of K (filter coefficient) in accordance with the measured/current flow) and the filter is applied to delayed AFR exhaust model (AFR2) model to fit nominal sensor. Block B is the block which functionality which determines a correction factor at the same current flow applied (via a multiplier) to the value of τ (filter coefficient) determined coming from block A to give a corrected filter coefficient τ to be applied to delayed AFR model to fit with the aged sensor. The way the correction factor (cf) is determined will be explained hereinafter. The table is then updated to provide revised correction values. In other words, in block A the volumetric flow is input into a look up table which determines the filter coefficient τnominal used to model the AFR model signal at the WRAF location. The output is then modified by the correction factor cf determined and output from block B to provide corrected τ.

Block A may include look-up tables or maps relating flow to the filter coefficient. Also block B may include look-up tables or maps relating the flow to the correction factor (cf); the filter coefficient τ is then modified according to the correction factor dependent on the ratio of gradients as described above AFR sensor and AFR model.

So block C is the correction factor block and the input to this is the input form the WRAF sensor and an input form the WRAF sensor model (at the same location). So in aspects the filter coefficients (cf) are adapted to be a function of flow so that the modelled air fuel ratio matches the sensor response. Block C is the multiplication block (between the Nominal coefficient and the Correction factor)

Worked Example

Figure 7:
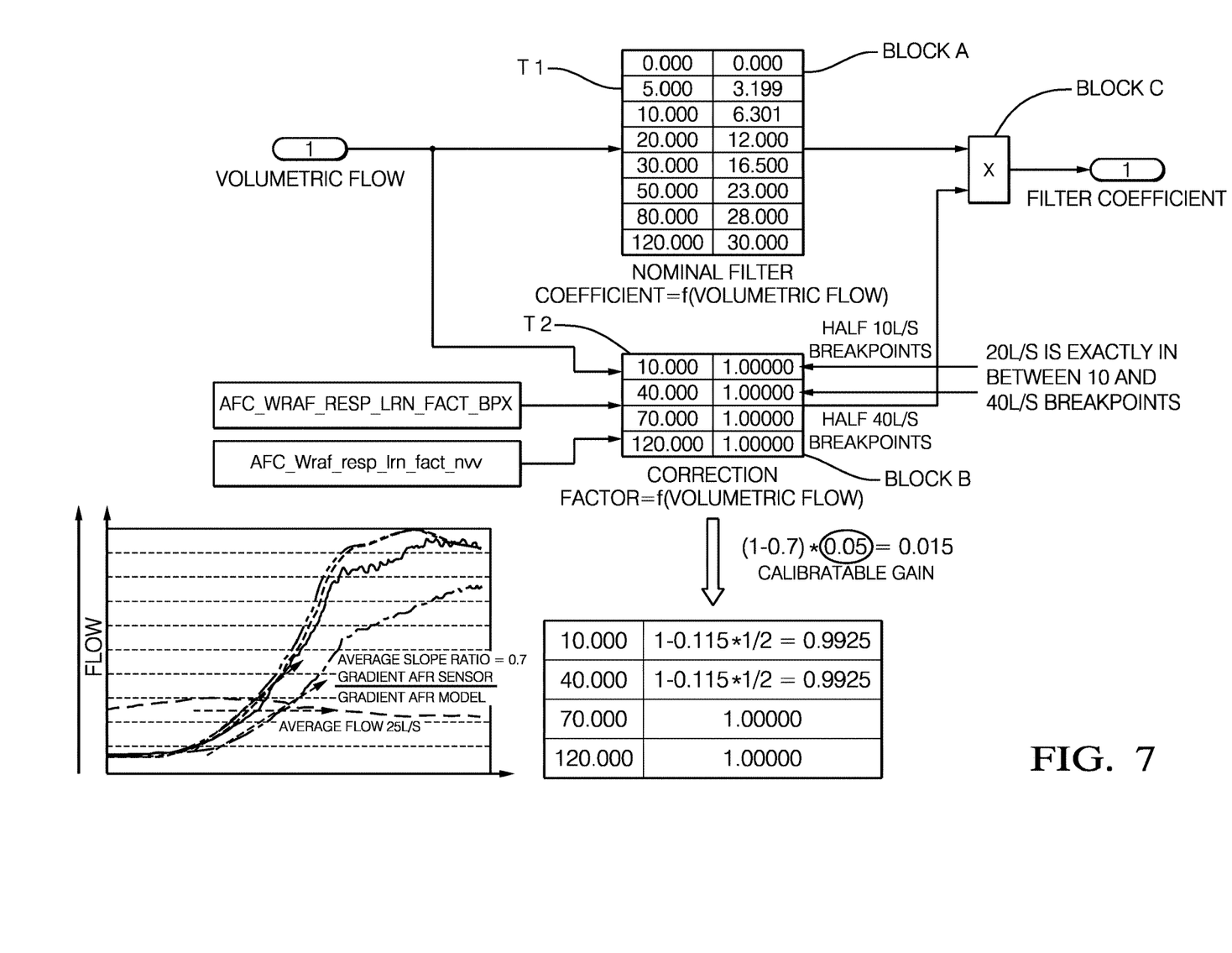
FIG. 7 shows a worked example.

FIG. 7 shows a worked example. In table T1 (Block A) the flow is measured and used to determine a value for the nominal filter coefficient K. The tables thereof also show how the correction factor (cf) is determined which is applied to the nominal filter value K. FIG. 7 is equivalent to FIG. 6 but expanded to show tables with a working example.

In the table T2 (=Block B) there is a flow dependent factor correction factor cf shown for discrete flow values of 10, 40, 70 and 120 l/s. The values may all be assumed to be 1. One or more of these can then be altered later according to the gradient ratio.

In the example on the figure the average volumetric flow over a period T1 where the gradients are determined, is 25 l/s. In the table this value is half way between the entry for 10 and 40 l/s. The average slope ratio (gradient AFR sensor/gradient model AFR over the period T1) is determined to be 0.7.

Assuming an initial values of 1 the correction factor cf applied to the filter (τ) is Initial value of cf−(calibratable gain*(1−gradient ratio))

So in this case with a calibratable gain of 0.05. The cf is 1−0.05*(1−0.7)=0.985.

The value of calibratable gain*(1−gradient ratio) can be regarded as a correction factor offset. In this case the correction factor offset 0.015. This offset can be used to update the entries for the correction factors in the table. In an example for the discrete flow rates that bound determined flow rate, the entries for the correction factor can be updated using the calculated correction offset factor. In this case the determined flow rate 25 l/s is halfway between the bounding entries of 10 and 40 l/s so the offset can be divided between them and applied to them. In this case the offset applied to them both is half of 0.015 so the entries for the correction factor are amended to 1−0.5*0.015=0.9925

The (filter) coefficient K which is determined (in the example dependent also on volumetric flow) from a look up table is then amended by the correction factor.

$K1=K0*cf$ where $K1$ is the revised filter coefficient and $K0$ is the initial filter coefficient.

So $\tau1=\tau0*CR1$ where $CR1=1/cf$ where=$\tau0$ is the original value of time constant and $\tau1$ the newly revised value of the time constant.

The table can be updated to amend the correction factors in the table that bound the value of flow; weighted accordingly.

Further Example

Figure 8A:
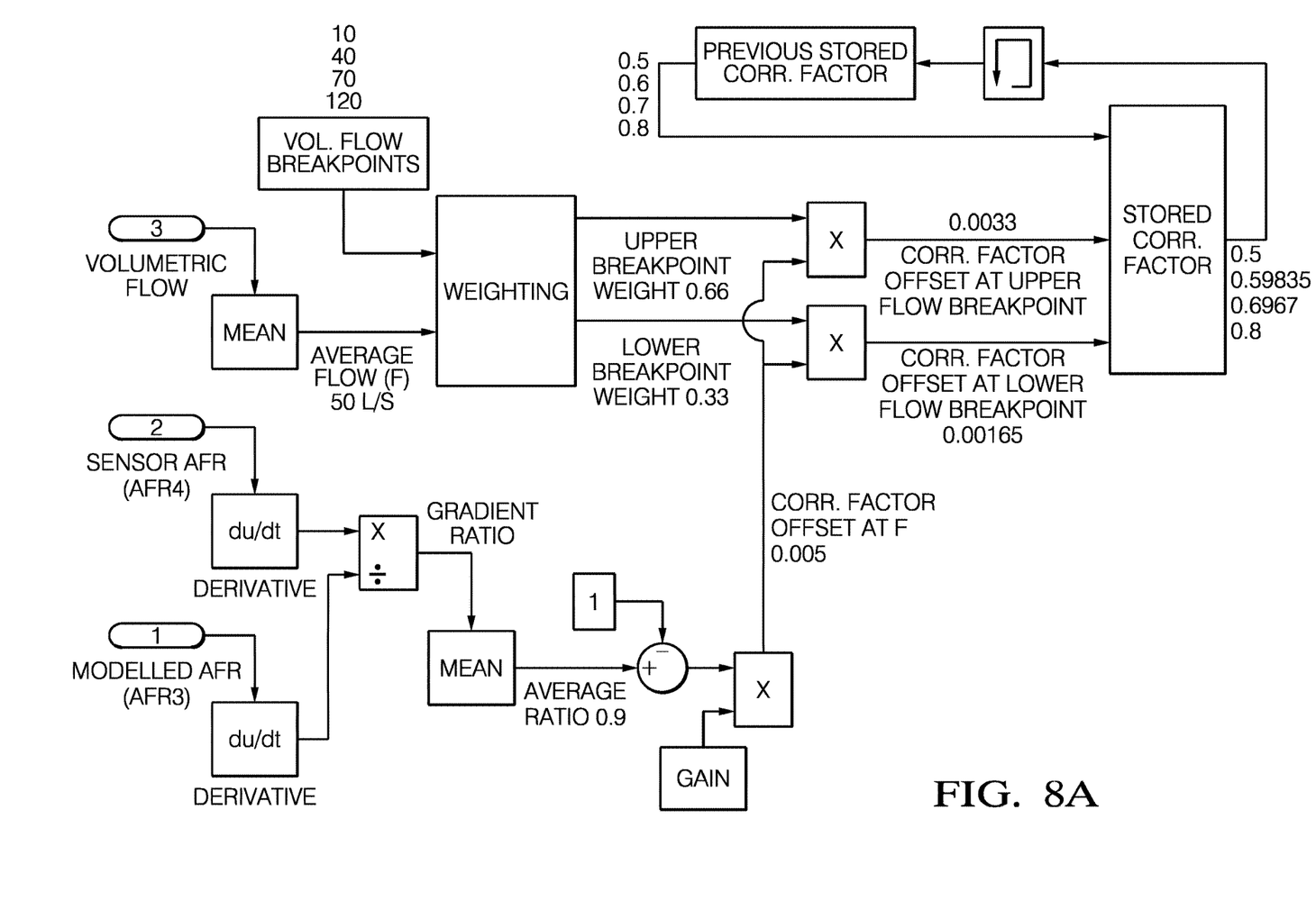
FIGS. 8*a* and 8*b* show a worked example in detail.

A further example will now be described with reference to FIG. 8. FIG. 8a shows how the correction factor (cf) is calculated and used to correct i.e. alter the coefficients of the filter coefficient K. For the above example, the correction factors (cf) are initially all equal to 1 (these may be the initial values before any iterative process) for example. In an iterative process the values may changes so for example the initial values may be 1 and after a learning process these values may be amended. In FIG. 8a the correction factors are initially stored as the following flow dependent correction factors. The following example show a table (for table T2 above) that may be used with already learnt flow dependent correction factors cf.

| Flow | Corr. Factor (cf) |
|------|-------------------|
| 10   | 0.5               |
| 40   | 0.6               |
| 70   | 0.7               |
| 120  | 0.8               |

In FIG. 8a the initial (flow based) correction factors are amended according to changes in sensor characterisitics. So again the inputs include the values of the modelled AFR (AFR3) and the sensor AFR (AFR4) and the gradient ratio is determined. In an example the average gradient ratio is determined to be=0.9 and an average flow=50 L/s.

An average gradient ratio of 0.9 means the slope of the actual aged AFR sensor is 90% of the current AFR model one. If the gain is=0.05, defining the speed of the learning process, 0.05 means 5% of the gradient ratio will be applied to the correction factor A correction offset is thus 0.05*(1−0.9)=0.005. This values is used to amend the stored values of the flow dependent correction factors. In a preferred embodiment the correction factor offset is applied differently to amend the stored flow dependent correction factors depending on the respective flow rates. In other words the correction factor will be amended more the closer the flow (in this case 50 L/c) is to the corresponding flow values for the correction factor. In the example the s correction offset corresponds to a 50 L/s flow, The table T2 (stored correction factor) can then be updated. This is performed by updating the two surrounding breakpoints, that is the discrete values of flow in the table that bounds the average flow during the method. The weighting is based on the distance between the average flow and the breakpoints.

50 is in between 40 and 70 L/s flow breakpoints
(50−40)/(70−40)=0.33-->33% to be applied to 40 L/s flow breakpoint
(70−50)/(70−40)=0.66-->66% to be applied to 70 L/s flow breakpoint
Finally 0.33*0.005=0.00165 is the correction offset applied to 40 L/s breakpoint
and 0.66*0.005=0.0033 is the correction factor offset applied to 70 L/s breakpoint.

| Flow | Corr. Factor (cf) |
|------|-------------------|
| 10   | 0.5               |
| 40   | 0.6 − 0.00165 = 0.59835 |
| 70   | 0.7 − 0.0033 = 0.6967 |
| 120  | 0.8               |

Figure 8B:
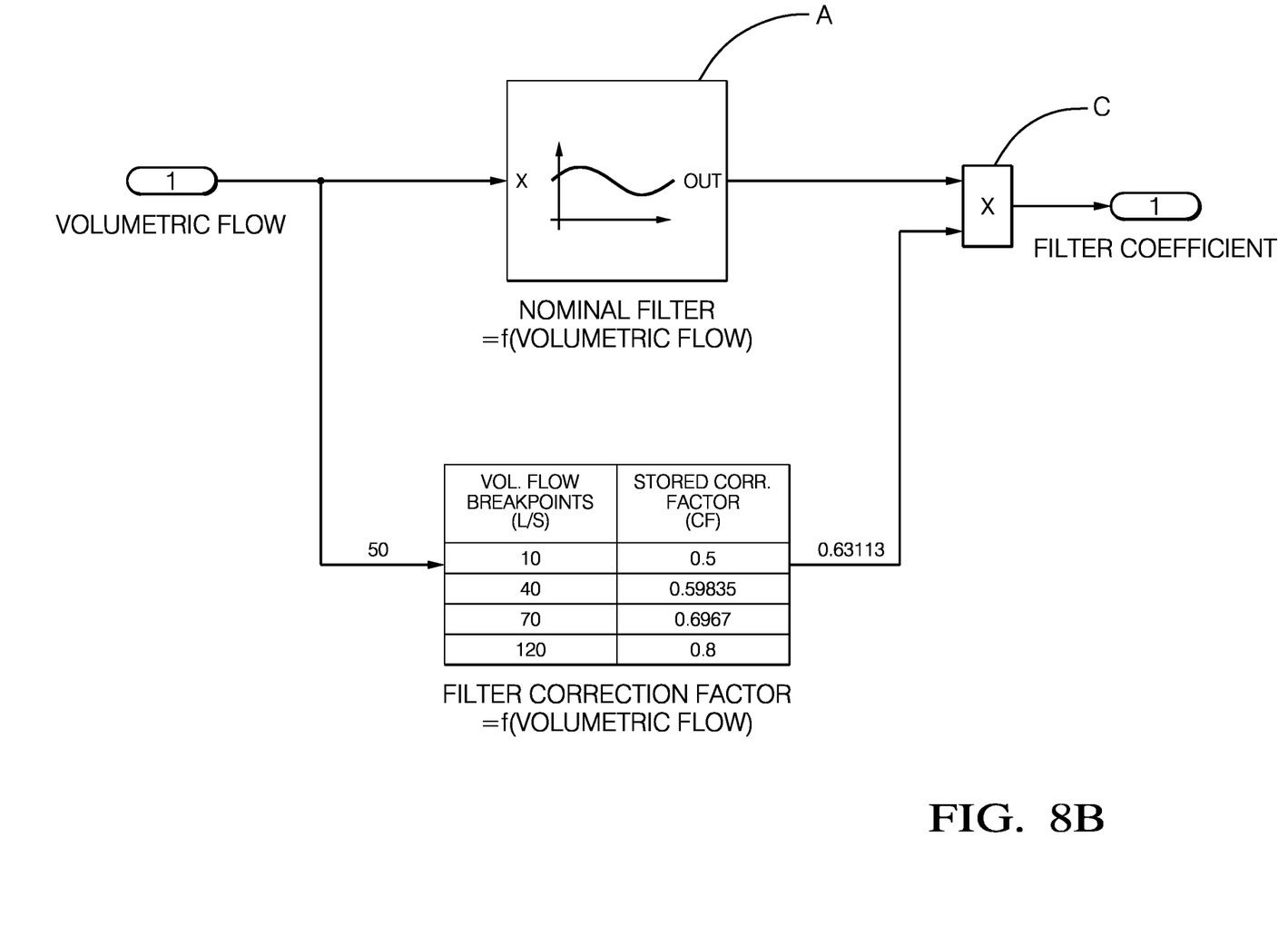

FIG. 8b then shows how correction factor can be applied. FIG. 8a effectively shows the learning phase where the correction factors are updated. In FIG. 8b the flow is measured and the equivalent (flow dependent) correction factor is determined and then used to amend the filter coefficient K or alternatively the time constant τ.

The invention claimed is:

1. A method of providing a model which provides parameters of an air/fuel ratio at a point where an air/fuel sensor is provided at a location in an exhaust system of an engine having an exhaust manifold, the method comprising:
   a) providing a first model which provides a first air/fuel ratio which is outlet from the exhaust manifold of said engine;
   b) measuring or estimating a volumetric flow rate through the exhaust system;
   c) applying a transfer function to the first air/fuel ratio determined by said first model to provide a model of air/fuel ratio at said location of said air/fuel sensor, said transfer function including a first order filter, said transfer function being dependent on said volumetric flow rate determined in step b), said transfer function having a time constant or a filter coefficient where the filter coefficient=1/the time constant; said time constant or the filter coefficient being determined based on the volumetric flow rate, characterised in amending the time constant or the filter coefficient by applying a correction factor; said correction factor being determined based on the following further steps:
   d) measuring a second air/fuel ratio at said location by said air/fuel sensor;
   e) over a time period, comparing the model of air/fuel ratio from step c) with the second air/fuel ratio from step d);
   f) determining or amending one or more correction factors to said filter coefficient or said time constant of said transfer function based on the comparing of step e); and
   g) using said model to adjust the fuel or air quantity to the engine;
   wherein step e) comprises comparing a first gradient of the model of air/fuel ratio from step c) with respect to time with a second gradient of the second air/fuel ratio measured by said air/fuel sensor in step d); and
   wherein said method includes determining a ratio of said first gradient and said second gradient and determining said correction factor based on said ratio.

2. The method as claimed in claim 1, where step c) comprises applying a delay in addition to said transfer function to said first air/fuel ratio determined by said first model to provide the model of air/fuel ratio at said location of said air/fuel sensor.

3. The method as claimed in claim 1, wherein said comparing in step e) includes determining a filter coefficient correction factor offset value, said filter correction factor offset value being defined as a calibratable gain*(1−gradient ratio), where the gradient ratio is said first gradient/said second gradient.

4. The method as claimed in claim 3, where said filter correction factor offset value is applied to and used to amend one or more stored or initial correction factors.

5. The method as claimed in claim 1, where determining or amending said one or more corrections factors to said filter coefficients or time constants of said transfer function is also based on said volumetric flow rate.

6. The method as claimed in claim 1, said method being implemented consequent to a change of A/F ratio from rich to lean.

7. The method as claimed in claim 1, wherein a turbocharger is located between the exhaust manifold and said location of said air/fuel sensor.

8. A method of providing a model which provides parameters of an air/fuel ratio at a point where an air/fuel sensor is provided at a location in an exhaust system of an engine having an exhaust manifold, the method comprising:
a) providing a first model which provides a first air/fuel ratio which is outlet from the exhaust manifold of said engine;
b) measuring or estimating a volumetric flow rate through the exhaust system;
c) applying a transfer function to the first air/fuel ratio determined by said first model to provide a model of air/fuel ratio at said location of said air/fuel sensor, said transfer function including a first order filter, said transfer function being dependent on said volumetric flow rate determined in step b), said transfer function having a time constant or a filter coefficient where the filter coefficient=1/the time constant; said time constant or the filter coefficient being determined based on the volumetric flow rate, characterised in amending the time constant or the filter coefficient by applying a correction factor; said correction factor being determined based on the following further steps:
d) measuring a second air/fuel ratio at said location by said air/fuel sensor;
e) over a time period, comparing the model of air/fuel ratio from step c) with the second air/fuel ratio from step d);
f) determining or amending one or more correction factors to said filter coefficient or said time constant of said transfer function based on the comparing of step e); and
g) using said model to adjust the fuel or air quantity to the engine;
wherein step e) comprises comparing a first gradient of the model of air/fuel ratio from step c) with respect to time with a second gradient of the second air/fuel ratio measured by said air/fuel sensor in step d); and
wherein step e) comprises amending the determined value of the time constant of said first order filter, referred to in step c), according to the equation: $\tau_{amended}$=the determined value of the time constant*the time constant correction factor determined from step f).

9. The method as claimed in claim 8, wherein initial values of the stored correction factors for the filter coefficient are amended according to the equation: updated correction factor=initial value of correction factor−(calibratable gain*(1−gradient ratio)) where the gradient ratio is said first gradient/said second gradient.

10. A method of providing a model which provides parameters of an air/fuel ratio at a point where an air/fuel sensor is provided at a location in an exhaust system of an engine having an exhaust manifold, the method comprising:
a) providing a first model which provides a first air/fuel ratio which is outlet from the exhaust manifold of said engine;
b) measuring or estimating a volumetric flow rate through the exhaust system;
c) applying a transfer function to the first air/fuel ratio determined by said first model to provide a model of air/fuel ratio at said location of said air/fuel sensor, said transfer function including a first order filter, said transfer function being dependent on said volumetric flow rate determined in step b), said transfer function having a time constant or a filter coefficient where the filter coefficient=1/the time constant; said time constant or the filter coefficient being determined based on the volumetric flow rate, characterised in amending the time constant or the filter coefficient by applying a correction factor; said correction factor being determined based on the following further steps:
d) measuring a second air/fuel ratio at said location by said air/fuel sensor;
e) over a time period, comparing the model of air/fuel ratio from step c) with the second air/fuel ratio from step d);
f) determining or amending one or more correction factors to said filter coefficient or said time constant of said transfer function based on the comparing of step e); and
g) using said model to adjust the fuel or air quantity to the engine;
wherein said method includes storing a MAP or look-up table of volumetric flow rates against said one or more corrections factors to said filter coefficients or time constants of said transfer function, and amending stored correction factors dependent on result of steps d) and e).

11. A method of providing a model which provides parameters of an air/fuel ratio at a point where an air/fuel sensor is provided at a location in an exhaust system of an engine having an exhaust manifold, the method comprising:
a) providing a first model which provides a first air/fuel ratio which is outlet from the exhaust manifold of said engine;
b) measuring or estimating a volumetric flow rate through the exhaust system;
c) applying a transfer function to the first air/fuel ratio determined by said first model to provide a model of air/fuel ratio at said location of said air/fuel sensor, said transfer function including a first order filter, said transfer function being dependent on said volumetric flow rate determined in step b), said transfer function having a time constant or a filter coefficient where the filter coefficient=1/the time constant; said time constant or the filter coefficient being determined based on the volumetric flow rate, characterised in amending the time constant or the filter coefficient by applying a correction factor; said correction factor being determined based on the following further steps:
d) measuring a second air/fuel ratio at said location by said air/fuel sensor;
e) over a time period, comparing the model of air/fuel ratio from step c) with the second air/fuel ratio from step d);
f) determining or amending one or more correction factors to said filter coefficient or said time constant of said transfer function based on the comparing of step e); and
g) using said model to adjust the fuel or air quantity to the engine;
wherein said first order filter is defined as a lag function of $(1/(\tau s+1))$ where $\tau$ is said time constant.

12. A method of providing a model which provides parameters of an air/fuel ratio at a point where an air/fuel sensor is provided at a location in an exhaust system of an engine having an exhaust manifold, the method comprising:
a) providing a first model which provides a first air/fuel ratio which is outlet from the exhaust manifold of said engine;
b) measuring or estimating a volumetric flow rate through the exhaust system;
c) applying a transfer function to the first air/fuel ratio determined by said first model to provide a model of air/fuel ratio at said location of said air/fuel sensor, said transfer function including a first order filter, said transfer function being dependent on said volumetric flow rate determined in step b), said transfer function having a time constant or a filter coefficient where the filter coefficient=1/the time constant; said time constant or the filter coefficient being determined based on the volumetric flow rate, characterised in amending the time constant or the filter coefficient by applying a correction factor; said correction factor being determined based on the following further steps:

d) measuring a second air/fuel ratio at said location by said air/fuel sensor;

e) over a time period, comparing the model of air/fuel ratio from step c) with the second air/fuel ratio from step d);

f) determining or amending one or more correction factors to said filter coefficient or said time constant of said transfer function based on the comparing of step e); and g) using said model to adjust the fuel or air quantity to the engine;

wherein step e) comprises amending the determined value of the filter coefficient K of the first order filter according to the equation: $K_{amended}$=determined value of the filter coefficient*the filter coefficient correction factor determined from step f).

* * * * *